United States Patent
Berger et al.

(10) Patent No.: US 6,448,766 B1
(45) Date of Patent: Sep. 10, 2002

(54) METHOD OF IMAGING A MAGNETIC FIELD EMANATING FROM A SURFACE USING A CONVENTIONAL SCANNING FORCE MICROSCOPE

(75) Inventors: Ruediger Berger, Heidesheim; Andreas H. Dietzel, Wallertheim, both of (DE); Jean Fompeyrine, Waedenswil (CH); Frank Krause, Mainz (DE); Jean-Pierre Locquet, Rueschlikon; Erich Maechler, Siebnen, both of (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/531,900

(22) Filed: Mar. 20, 2000

(30) Foreign Application Priority Data

Mar. 20, 1999 (EP) .............................. 99105725

(51) Int. Cl.[7] ...................... G01R 33/02; G01R 33/032; G01R 33/10; G01R 33/12; G01N 23/00
(52) U.S. Cl. ...................... 324/244; 324/212; 324/235; 324/244.1; 324/260; 250/306

(58) Field of Search ................................. 324/205, 212, 324/235, 244, 244.1, 249, 260, 261, 262; 73/105; 250/306, 307, 311; 365/171, 172

(56) References Cited

U.S. PATENT DOCUMENTS

| | | | | |
|---|---|---|---|---|
| 4,894,615 A | * | 1/1990 | Mermelstein | 324/244 |
| 5,103,174 A | * | 4/1992 | Wandass et al. | 324/244 |
| 5,442,288 A | * | 8/1995 | Fenn et al. | 324/244 |
| 5,612,491 A | * | 3/1997 | Lindsay | 73/105 |
| 5,646,882 A | * | 7/1997 | Watanuki et al. | 365/171 X |
| 5,900,729 A | * | 5/1999 | Moser et al. | 324/244 |
| 5,998,995 A | * | 12/1999 | Osiander et al. | 324/260 X |
| 6,220,084 B1 | * | 4/2001 | Chen et al. | 73/105 |

* cited by examiner

Primary Examiner—Gerard R. Strecker
(74) Attorney, Agent, or Firm—Ronald L. Drumheller

(57) ABSTRACT

Magnetic characterization of the magnetic field emanating from an RWH device is presented using a magnetostrictive layer as a probe between the device and the scanned SFM tip. The findings suggest a very promising technique to resolve magnetic fields laterally at least in the 100 nm realm. Other magnetosensitive properties such as the magnetoelastic and the piezomagnetic effect can be used in a similar way to infer magnetic characteristics of microstructures or of magnetic multilayers.

14 Claims, 4 Drawing Sheets

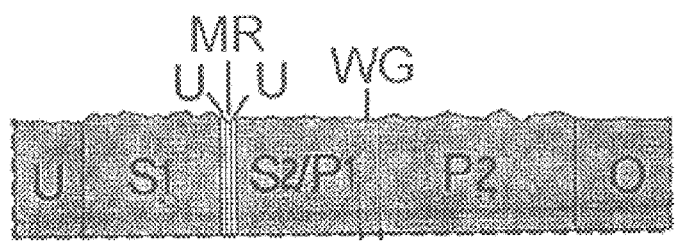
FIG. 1A
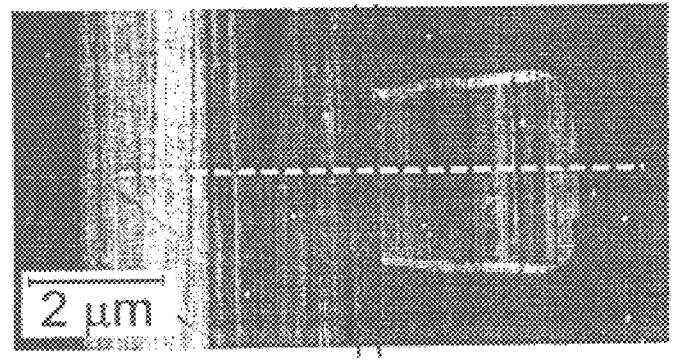
FIG. 1B
FIG. 1C
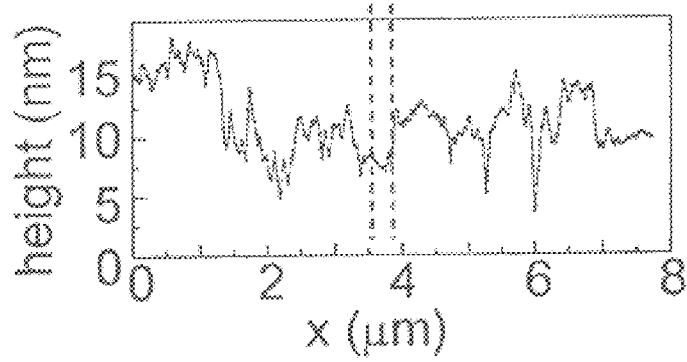
FIG. 1D
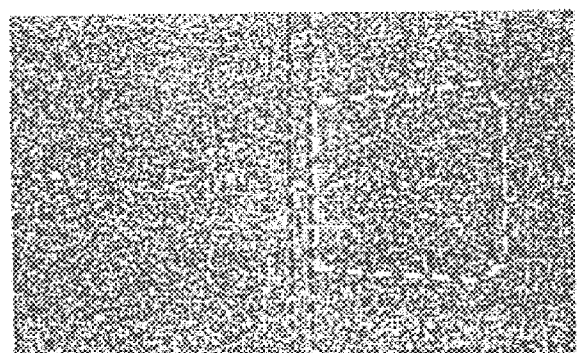
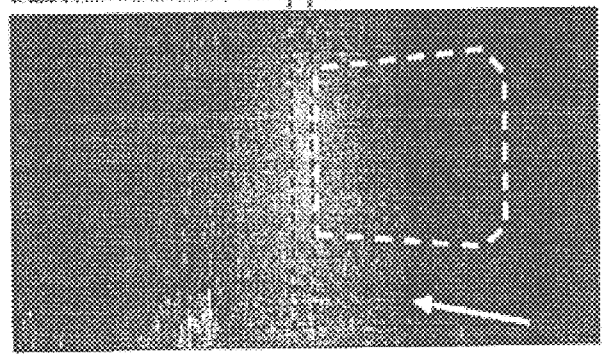
FIG. 1E

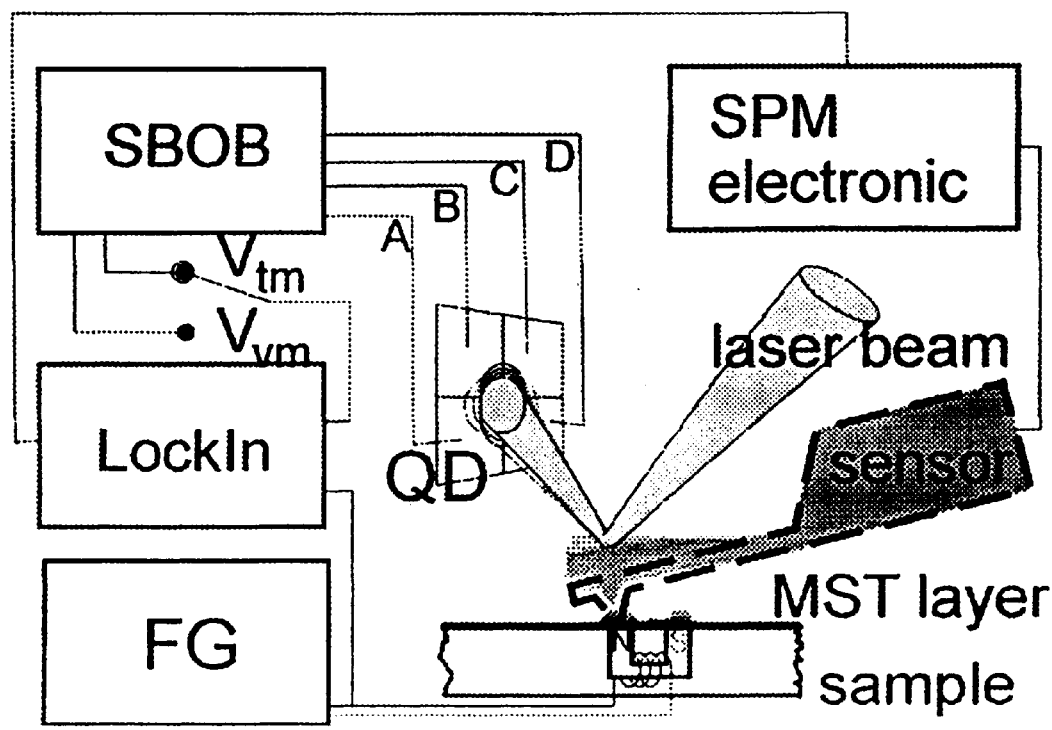
FIG. 2
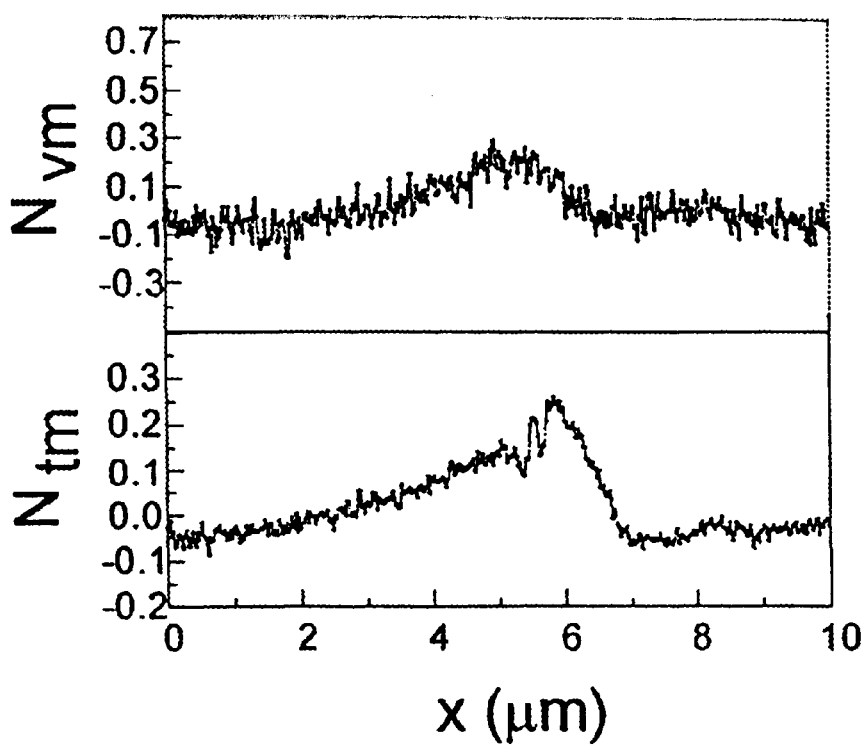
FIG. 3A
FIG. 3B

METHOD OF IMAGING A MAGNETIC FIELD EMANATING FROM A SURFACE USING A CONVENTIONAL SCANNING FORCE MICROSCOPE

FIELD OF THE INVENTION

The present invention in general relates to a novel scanning force microscopy method. More specifically, it relates to a method for characterizing magnetic fields. Still more specifically, the present invention relates to such a method using magnetosensitive materials. The invention relates also to a device for carrying out such a method as well as to a novel scanning probe to carry out the method according to the invention.

BACKGROUND OF THE INVENTION

With the continuously increasing recording density in magnetic storage media and the continual improvement in quality of magnetic heads in recent years it has become ever more important to be able to measure the spatial distribution of a magnetic field as accurately as possible, since this distribution in the vicinity of the gap in a magnetic head represents a factor which has a profound influence on the recording, overwrite and playback properties.

Magnetic writing and recording heads are therefore a field of intense research and development that requires extremely sensitive techniques to estimate device parameters for further miniaturization. In addition, it is desirable for process control that scientific and technical feedback for manufacturing parameters are enabled as early as possible in the production process, in particular on a row or even on wafer level. Micro- and nanostructures are often characterized by scanning probe Microscopy (SPM) in research as well as in analytical disciplines for online quality control and failure analysis. SPM can attribute different but specific functionalities that allow a characterization of various surface properties, e.g. surface roughness, conductivity variations, magnetism, hardness, thermal and friction phenomena on the nanometer scale. In storage industries, magnetic force microscopy (MFM) techniques have been used to characterize magnetic storage disks and thin-film magnetoresistive recording heads. Equally, micrometersized magnetic writing heads are a major technology undergoing miniaturization to realize smaller bit sizes and thereby higher areal density in the magnetic recording media.

STATE OF THE ART

Techniques to image magnetic properties are based on electron microscopy such as spin polarized scanning electron microscopy (cf. R. Allenspach, Physics World, 7, 45 (1994)), Lorentz microscopy (cf. X. Portier et al., Appl. Phys. Lett., 71, 22032 (1997)), Magnetic Force Microscopy (cf. Y. Martin and H. K. Wickramasinghe, Appl. Phys. Lett. 50, 1455 (1987)), Spin Polarized Electron Tunneling Microscope (cf. Z. Wu et al., Surface Science, 386, 311 (1997)) Scanning Near Field Magnetooptical Microscopy (cf. U. Hartmann, Journal of Magnetism and Magnetic Materials, 157/158, 545 (1996)) and Kerr microscopy (A. Hubert and R. Schafer,. Magnetic Domains, The Analysis of Magnetic Microstructures, New York 1998).

In particular in MFM, one mode is to resonate the magnetic sensor via a bimorph and to detect phase shifts owing to variable magnetic forces. Another mode, which is used to characterize write elements, is to excite MFM sensor vibrations via the variable magnetic field of the write element. In this mode the vibrational characteristics of the MFM sensor changes in dependance of its position above the write element. Both techniques feature a high lateral resolution (approx. 50 nm), but the high magnetic field generated by the write element can cause the magnetic tip to touch the surface, resulting in imaging errors (hereinafter referred to as artifacts). In addition, magnetic fields above the coercive field of the scanning tip alter its magnetic moments. The latter can cause severe imaging errors (hereinafter referred to as artifacts) and may lead to a misinterpretation of measured device parameters.

It is therefore an object of the present invention to provide a method to characterize magnetic fields and magnetic properties of microstructures that do not suffer from the above mentioned artifacts.

It is a further object of the invention to characterize such magnetic fields emanating from micrometer-sized devices, especially from magnetic read/write heads (RWH) used in storage technology.

It is still a further object of the present invention to characterize the magnetic fields using a non-magnetic, standard tip as a local probe.

Further advantageous embodiments of the invention are contained in the dependent claims.

BRIEF DESCRIPTION OF THE DRAWINGS

FIG. 1A shows the layering sequence on the surface of a read/write head to be characterized with the method according to the invention, FIG. 1B depicts the scanning force microscope (SFM)-topography of the read/write head of FIG. 1A, FIG. 1C is a linescan across the pole tips of the head shown in FIG. 1B, FIG. 1D shows the responses of a laterally scanned non-magnetic tip in the vertical mode, according to the invention, FIG. 1E shows the responses, but in the torsion mode, FIG. 2 schematically depicts a measuring principle of the method according to the invention, FIGS. 3A and B shows line scans across the RWH writing gap of both, normalized vertical mode and torsional mode signals.

SUMMARY OF THE INVENTION

Figure 4:
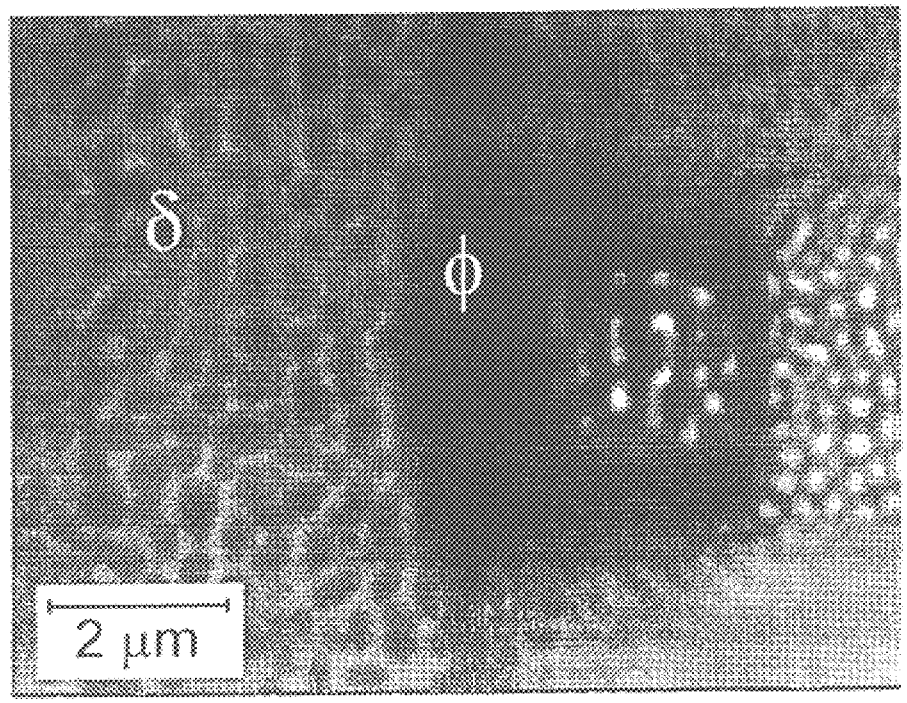
FIG. 4 is an mfm image of a coated microstructure according to the invention.

The present invention presents a novel technique to characterize magnetic fields emanating from micrometer-sized devices by using a magnetosensitive (MSE) layer situated between the scanning probe microscope tip and the magnetic RWH device. In case the MSE layer Is situated on the substrate or at a definite distance from the substrate, preferably a thin film layer is used.

For the first time, a magnetosensitive layer is used to laterally probe the variation of a magnetic field in a microstructure. The technique features magnetic characterization by using a non-magnetic tip as local probe, which allows the use of commercially available, well-defined, standard scanning force microscopy (SFM) sensors.

It has to be mentioned that the subject-matter of the present invention is not restricted to RWH but can in principle be applied to all objects, materials, samples and devices generating a magnetic field. MSE materials, in particular magnetostrictive (MST) materials, which change their length upon an applied magnetic field, are used for example as powerful transducer systems and as one layer of a spin-valve strain sensor to detect small deflections. MST refers to any changes in dimensions of a magnetic material caused by a change in its magnetization. There are several types of magnetostriction: i) Joule magnetostriction when the change in dimension is parallel to the applied field, ii) Transverse joule magnetostriction when the change in dimension is perpendicular to the applied field, iii) volume magnetostriction, iv) the Guillemin effect leading to a bending under the magnetic field and v) the Wiedemann effect leading to a twisting under the magnetic field.

Properties of magnetostrictive layers are inferred from the bending of cantilevers coated on one side and exposed to varying external magnetic fields or by a direct measurement of the extension or contraction of MST materials in a known external magnetic field. Those extension measurements can be performed by means of Scanning Tunneling Microscopy. In addition, SFM topography data has been used to calculate the magnetostrictive coefficient from surface deformations in Terfenol-D crystals. Furthermore, a magnetometer has been built based on the detection of magnetostrictive extension by using a tunneling displacement sensor (cf. R. A. Brizzolara and R. J. Colton, J. Magn. Mat., 88, 343–350 (1990); A. P. Holden, D. G. Lord and P. J. Grundy, J. Appl. Phys., 79, 6070–6072 (1996); J. H. Wandass, J. S. Murday and R. J. Colton, Sensors and Actuators, 19, 211–225 (1989)).

It has to be noted that the present invention is not restricted to MST materials. It can also be used with any material which changes its mechanical properties in dependance with its magnetization or in dependance with an external applied magnetic field, e.g. piezomagnetic and magnetoelastic material. Piezomagnetic materials are for instance $\alpha$-$Fe_2O_3$ and $Fe_xNi_yB_z$ with high piezomagnetic coupling coefficients. Preferably, in this case x=40, y=40 and z=20. As a first advantage, piezomagnetic materials exhibit a linear dependence in their field induced deformation, while for magnetostrictive materials this dependence is quadratic. Another advantage stems from the fact that piezomagnetic effect can be found in materials with small magnetization.

Magnetoelastic materials such as FewBxSiyCz, preferably amorphous $Fe_{81}B_{13.5}Si_{3.5}C_2$ (w=81, x=13.5, y=3.5 and z=2) show, upon the application of a magnetic field, a change in Youngs modulus $E/E_0$ of 10.0. Since elastic properties of materials also affect their surface, any mechanical interaction between the tip and the surface is field-dependent, whether the magnetoelastic material is situated at the sample surface, or at the tip. The parameters related to this interaction, such as the contact area, will then be field-dependent. These changes can be detected in contact mode through a change in the friction forces of the probed surface, or in tapping-mode through a change in frequency, amplitude or phase of the sensor vibrations.

In the following the invention will be explained in greater detail with respect to magnetic read/write heads.

DETAILED DESCRIPTION OF THE PREFERRED EMBODIMENT

In the present invention, magnetic fields H, generated in a microstructure emanating in a magnetostrictive thin overlayer cause deformations in dependance to the local magnitude of H.

FIG. 1A shows a schematic cross section of a RWH used to demonstrate the method according to the invention. The magnetic field emanating from the RWH can be controlled by varying the write coil current $I_{RWH}$, using an external current source (frequency generator). Magnetic fields as high as $2.0 \times 10^5$ $Am^{-1}$ can be generated, located mainly between pole tips $P_1$ and $P_2$. A topographic image recorded by SFM, representative of these microstructures, is presented in FIG. 1B, which clearly displays surface features of both pole tips and the magnetic shielding layer. A line scan along the layers is plotted in FIG. 1C and topographic variations are measured to be typically in the range of 5 to 10 nm. In FIG. 1A, U is the undercoat, $S_1$ and $S_2$ are magnetic shields (sendust, NiFe or sendust, Permalloy), MR is the magnetoresistive sensor including its wiring, P1 and P2 are the magnetic pole tip ends, WG is the writing gap and O is the overcoat layer ($Al_2O_3$).

FIG. 1B depicts the SFM topography of an RWH displayed as a gray-scale image having a z-range of 20 nm and FIG. 1C shows a corresponding line scan across the pole tips, indicated by the dashed line in FIG. 1B, showing the typical surface corrugation.

One possibility of situating the MSE layer between the SFM tip and the magnetic RWH device is to coat the pole tip region of the RWH. For example, a magnetostrictive film of Tb—Pe approx. 150 nm thick was dc-sputter-deposited on the substrate. From an additional SFM topographic analysis of the same RWH element as presented in FIG. 1B, it was found that the deposition of Tb—Fe did not significantly change topographic features on the surface. Tb—Fe increases its length in the direction of the magnetic field; the bulk magnetostriction at saturation magnetic fields was measured to be approximately $700 \times 10^{-6}$.

A magnetic field applied perpendicular to the thin magnetostrictive film causes a maximal thickness change of approx. 0.1 nm, which superposes surface roughness. From the 16-bit resolution of the analog to digital-converter of the SPM controller, a theoretical vertical piezo-resolution of the order of 0.01 nm was calculated, which is not conveniant for quantitatively determining a magnetic field-induced thickness change of a thin magnetostrictive layer.

One way to overcome these limits is to modulate the magnetic field of the RWH by a modulated $I_{RWH}$, which results in a periodic deformation of the magnetostrictive thin film. Local deformations of the surface actuate a laterally scanned force microscope cantilever operated in the contact mode, schematically outlined in FIG. 2. This technique is not limited by the above-described piezo-resolution, nor was observed that topography such as steps superpose the LockIn output signal when the magnetosensitive layer is actuated above 1.5 kHz and the SFM probe is scanned slowly.

The setup of the electronic components and the measuring principle is outlined schematically in FIG. 2. A sensor controlled by SPM electronics is operated in contact mode and is scanned above a magnetic field source. At zero magnetic field a uniformly deposited MSE layer shows no lateral magnetic field dependant variations and the topography of the device is measured. The sensor operating in this mode is drawn with dashed lines. The frequency and/ magnitude of the magnetic field in a sample can be varied by the settings of a frequency generator (FG). Now the response of the MST layer, e.g. a thickness change, follows variations of the magnetic field. When the tip of the sensor is scanned the cantilever follows the magnetic-field induced deformation of the MST layer. Varying the magnitude of the magnetic field periodically results in a likewise periodically actuated sensor. Deflections of the cantilever are measured by the beam deflection principle. The signals of the quadrant detector (QD), A, B, C, D are used to convert vertical and torsional deflections into voltages, Vvm and Vtm, whereby $V_{vm}=(B+C-A-D)/(A+B+C+D)$ and $V_{tm}=(A+B-C-D)/(A+B+C+D)$. Both voltages can be read out using a signal break out box (SBOB) and an electronic switch allows to select one signal which is compared with the FG voltage in a LockIn amplifier. The LockIn output voltage is connected to the SPM electronics and is used to display the cantilever response as a function of its position.

In FIG. 1D there is shown the vertical response amplitude $V_{vm}$ (vertical mode) of the magnetostrictive overcoat at a position and scan size similar to the topography presented in FIG. 1B but with an oscillating magnetic field. The response encoded in darker grey (stronger response) and brighter gray tones (weak response).

FIG. 1E shows the torsional response amplitude $V_{tm}$, able to resolve structures of typical size in magnetic domains.

The LockIn responses in the vertical mode (vm) (FIG. 1D) and the torsion mode (tm) (FIG. 1E) of the laterally scanned non-magnetic tip are presented as gray-scale images. Brighter areas indicate in both modes an increasing sensor oscillating amplitude, in the present example a stronger response to magnetostrictive induced changes in the Tb—Fe layer. Darker areas represent a decreasing oscillating amplitude or a weaker response to the magnetostrictive layer. The maximum responses, in both modes were measured between the two pole tips (writing gap), which is consistent with magnetic characterizations performed by other techniques. The magnetic field was observed to be symmetric to the underlying device structure for both modes. In the tm, even details of the domain structure of the magnetostrictive layer are visible (indicated by an arrow in FIG. 1E). These small features were used to estimate the lateral resolution of the technique, which is in the 100 nm realm. To compare the responses recorded in both modes, two line scans of the normalized values ($N_{vm}=V_{vm}/V_{noise}$, $N_{tm}=V_{tm}/V_{noise}$, where $V_{noise}$ are the noise voltages in both modes) of the LockIn signals oriented similarly to that of the topographic image are plotted in FIGS. 3A and B. It was calculated that the response magnitude was a factor of approx. 3.5 better in the torsional mode than in the vertical mode.

In addition the coated microstructure was imaged by MFM as a reference experiment with the write current switched on for the entire duration. The MFM image presented in FIG. 4 clearly displays magnetic domains (indicated by δ) of the Tb—Fe thin film as well as the magnetic writing field, which is indicated by Φ.

Figure 5:
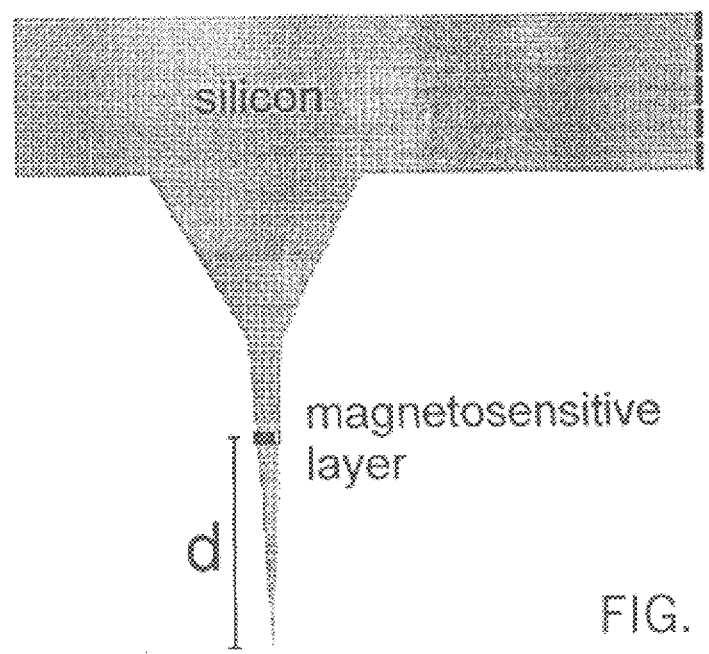
FIG. 5 schematically shows the integration of a magnetosensitive layer into a sfm tip according to the invention.

Another technique to characterize magnetic fields emanating from devices may be the integration of a MSE layer into an SFM tip as outlined schematically in FIG. 5. In this case, however, the layer might no longer be a thin film layer. Varying the distance d between the tip apex and the magnetosensitive layer allows the detection of the magnetic field at typical RWH to storage media distances. The outlined mode enables the detection of magnetic fields at higher resolution owing to the reduced lateral size of the magnetostrictive layer and the resulting free actuation compared to the "clamped actuation" in thin films.

The layer can be incorporated in the tip either by sequential vacuum deposition techniques or by a means of focussed ion beam techniques.

A third way to carry out the present invention is to situate the MSE layer somewhere between the scanning tip and the sample surface, but not in direct contact with the sample where magnetic fields have to be characterized. This can be realized by using micromachining techniques. There the MSE layer is structured that way that it spans above the magnetic field at a defined distance to the surface. Another way of realizing the defined spacing between the sample surface avoiding a direct contact is to precoat the surface by a soft spacer material, e.g. an organic material, which allows the MSE surface to be deformed more freely by the underlying varying magnetic field.

Figure 6:
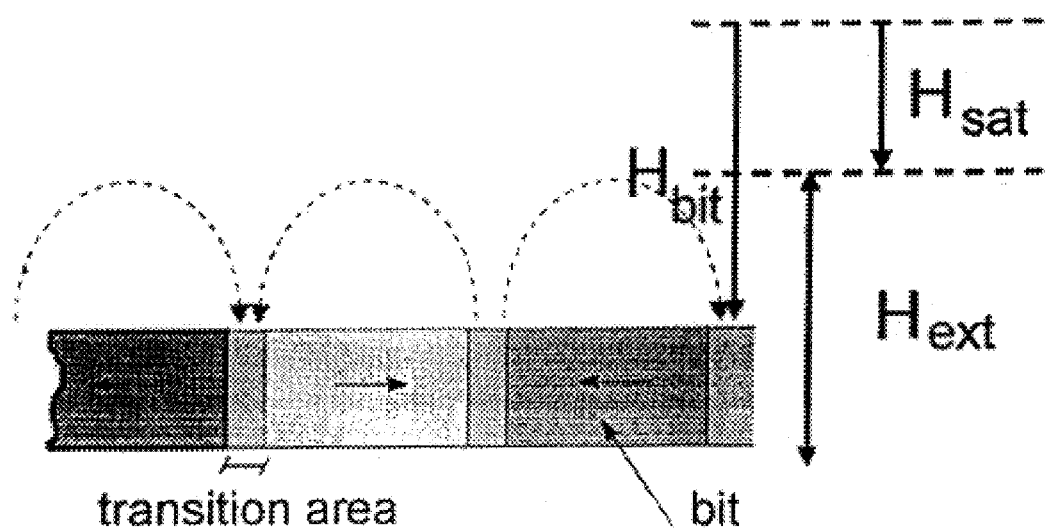
FIG. 6 shows the schematic arrangement of magnetic fields which allows to detect bit structures according to the invention.

Static magnetic fields, e.g. bit structures in samples, can be detected by using of an additional external magnetic field and a soft magnetic, piezomagnetic tip. This is depicted in FIG. 6, wherein $H_{ext}$ is the external oscillating magnetic field, $H_{bit}$ is the magnetic field emanating from the transition area, and $H_{sat}$ is the saturation field of the scanning magnetic probe. The saturation field of the scanning probe must be slightly lower than the magnetic field of the bit structure at the transition area. Furthermore the external field must be smaller than the coercivity of the sample and also small enough not to drive the scanning probe out of it's magnetization in case the tip is positioned above a transition area. In case this tip is positioned above a transition area it will be completely magnetized, i.e. it has its maximum or minimum expansion owing to the piezomagnetic effect, depending on the direction of the bit change. Outside the transition area, however, the tip is not completely magnetized. In case an alternating magnetic field is now applied, then within the transition areas the magnetic field and the modulated external field exceed the tip saturation field, and small expansions take place. Outside the bit change areas, however, the magnetization of the tip, and thus the expansion, oscillates with the frequency of the external field. This behavior can be used to image the bit track by plotting the oscillation amplitude versus the position of the tip.

There is a large variation of the amplitude and signs of MST coefficients from one material to the other and for a given material from one orientation to the other. Instead of characterizing the magnetic field itself, the magnetic behaviour in a material or in multilayers owing to a variable external magnetic field can be studied. Hence magnetic material parameters (magnetostrictive, magnetoelastic or piezomagnetic coefficients) can be extracted on a scale of magnetic domains, such as the sign and the orientation of the magentization. Scanning of the probe across different material layers allows to study coupling phenomena, which change magnetostriction, magnetoelasatic or piezomagnetic properties at the interface of these layers.

Several advantages of the reported technique compared to MFM techniques can be found. First, the technique allows the use of standard SFM cantilevers for lateral imaging of magnetic field variations. Second, images recorded by MFM, especially using frequency modulation techniques, do not display the emanating magnetic field directly. The reconstruction of the magnetic field can be simplified by using MSE layers having a linear response with magnetic fields. The MSE layer, when integrated in the scanning tip, cannot be altered mechanically during lateral scanning, which avoids one source of imaging artifacts. It is foreseen that the reported and related techniques can be used for characterization of a wide range of magnetic materials and also for industrial process control.

What is claimed is:

1. Method for imaging a magnetic field emanating from a surface of an object using a Scanning Force Microscope, comprising the steps of:

arranging a magnetosensitive layer between the surface of the object and a probe tip of the Scanning Force Microscope, the magnetosensitive layer having a magnetic field induced mechanical property with a local value that depends upon a corresponding local magnetic field intensity; and scanning the magnetosensitive layer with the probe tip of the Scanning Force Microscope, the Scanning Force Microscope imaging variation in the magnetic field induced mechanical property of the magnetosensitive layer, thereby producing an image of the magnetic field emanating from the surface of the object using a Scanning Force Microscope.

2. Method according to claim 1, wherein said magnetosensitive layer is a thin film layer.

3. Method according to claim 1, where said magnetosensitive layer is a multilayer of different materials.

4. Method according to claim 1, wherein said magnetosensitive layer is microstructured layer.

5. Method according to claim 1, wherein said sensor is a non-magnetic tip.

6. Method according to claim 1, wherein said magnetosensitive layer is selected from the group consisting of magnetostrictive, magnetoelastic and/or piezomagnetic layers.

7. Method according to claim 6, wherein the magnetostrictive layers are selected from the group consisting of $SmFe_2$ and $TbFe_2$.

8. Method according to claim 6, wherein the magnetoelastic layers are selected from the group consisting of $Fe_wB_xSi_yC_z$ and Ni.

9. Method according to claim 8, wherein w=81, x=13.5, y=3.5 and z=2.

10. Method according to claim 6, wherein the piezomagnetic layers are selected from the group consisting of $\alpha$-$Fe_2O_3$ and $Fe_xNi_yB_z$.

11. Method according to claim 10, wherein x=40, y=40 and z=20.

12. Method according to claim 1, wherein said layer is arranged on the surface of said object.

13. Method according to claim 1, wherein said layer is arranged at a fixed distance from the surface of said object.

14. In a Scanning Force Microscope for imaging force applied to a probe during scanning thereof across a surface, an improved probe comprising:

a probe body responsive to applied force; and a magnetosensitive layer carried by the probe body and responsive to a local magnetic field intensity emanating from a surface being scanned by the probe to produce a mechanical property value of the layer that corresponds to the local magnetic field intensity emanating from the surface being scanned, the magnetosensitive layer in turn applying a force onto the probe body that corresponds to the mechanical property value of the layer, for producing an image with the Scanning Force Microscope of the magnetic field emanating from the surface being scanned.

\* \* \* \* \*